(12) United States Patent
Waller, Jr.

(10) Patent No.: US 11,641,183 B2
(45) Date of Patent: May 2, 2023

(54) AUDIO DYNAMICS PROCESSING CONTROL SYSTEM WITH INTEGRATION RELEASE WINDOW

(71) Applicant: James Kinney Waller, Jr., Clarkston, MI (US)

(72) Inventor: James Kinney Waller, Jr., Clarkston, MI (US)

(73) Assignee: EAR PHYSICS, LLC, Clarkston, MI (US)

( * ) Notice: Subject to any disclaimer, the term of this patent is extended or adjusted under 35 U.S.C. 154(b) by 0 days.

(21) Appl. No.: 16/661,954

(22) Filed: Oct. 23, 2019

(65) Prior Publication Data

US 2020/0177147 A1 Jun. 4, 2020

Related U.S. Application Data

(60) Provisional application No. 62/750,369, filed on Oct. 25, 2018.

(51) Int. Cl.
*H03G 7/06* (2006.01)
*H04R 29/00* (2006.01)
*H04R 3/00* (2006.01)

(52) U.S. Cl.
CPC ............... *H03G 7/06* (2013.01); *H04R 3/00* (2013.01); *H04R 29/001* (2013.01)

(58) Field of Classification Search
CPC ........... H03G 7/06; H04R 3/00; H04R 29/001
See application file for complete search history.

(56) References Cited

U.S. PATENT DOCUMENTS 5,483,600 A * 1/1996 Werrbach ............... H03G 7/002
333/14
6,628,795 B1 * 9/2003 Ludvigsen ........... H04R 25/356
381/107

(Continued)

*Primary Examiner* — Daniel R Sellers
(74) *Attorney, Agent, or Firm* — Frank J. Catalano; Gable Gotwals

(57) ABSTRACT

An improved dynamics processing control system incorporates an integration release window to virtually eliminate ripple in the final control signal used to control a Voltage Controlled Amplifier in a signal processor. The input audio signal is level detected using a logarithmic level detector and filtered to provide a very fast time constant. The fast release time constant signal is clamped at a maximum level equal to the user defined threshold and filtered by a second filter providing a very long release time constant. The long release time constant is dynamically varied by the fast time constant to provide an adaptive slow time constant. The fast time constant signal modifies the adaptive slow time constant when the difference between the fast time constant and the slow time constant exceeds a predefined integration release window. The integration release window is based on a minimum number of decibels which is larger than the maximum possible ripple in the fast time constant signal. The integration release window tracks the adaptive slow time constant signal to maintain the integration release window over the entire release range of the adaptive slow time constant decay. Once the difference between the fast time constant signal and adaptive slow time constant signal is less than the integration release window, the slow release signal reverts to the un-altered slow time constant release response.

3 Claims, 4 Drawing Sheets

(56) References Cited

U.S. PATENT DOCUMENTS

| | | | | |
|---|---|---|---|---|
| 6,944,305 B2* | 9/2005 | Waller | ................... | H03G 7/002 381/104 |
| 2003/0012393 A1* | 1/2003 | Armstrong | ............. | G01R 19/02 381/321 |
| 2014/0016791 A1* | 1/2014 | Smith | ................... | H03G 9/025 381/57 |
| 2014/0177891 A1* | 6/2014 | Scheller | ................ | H04R 25/50 381/321 |

* cited by examiner

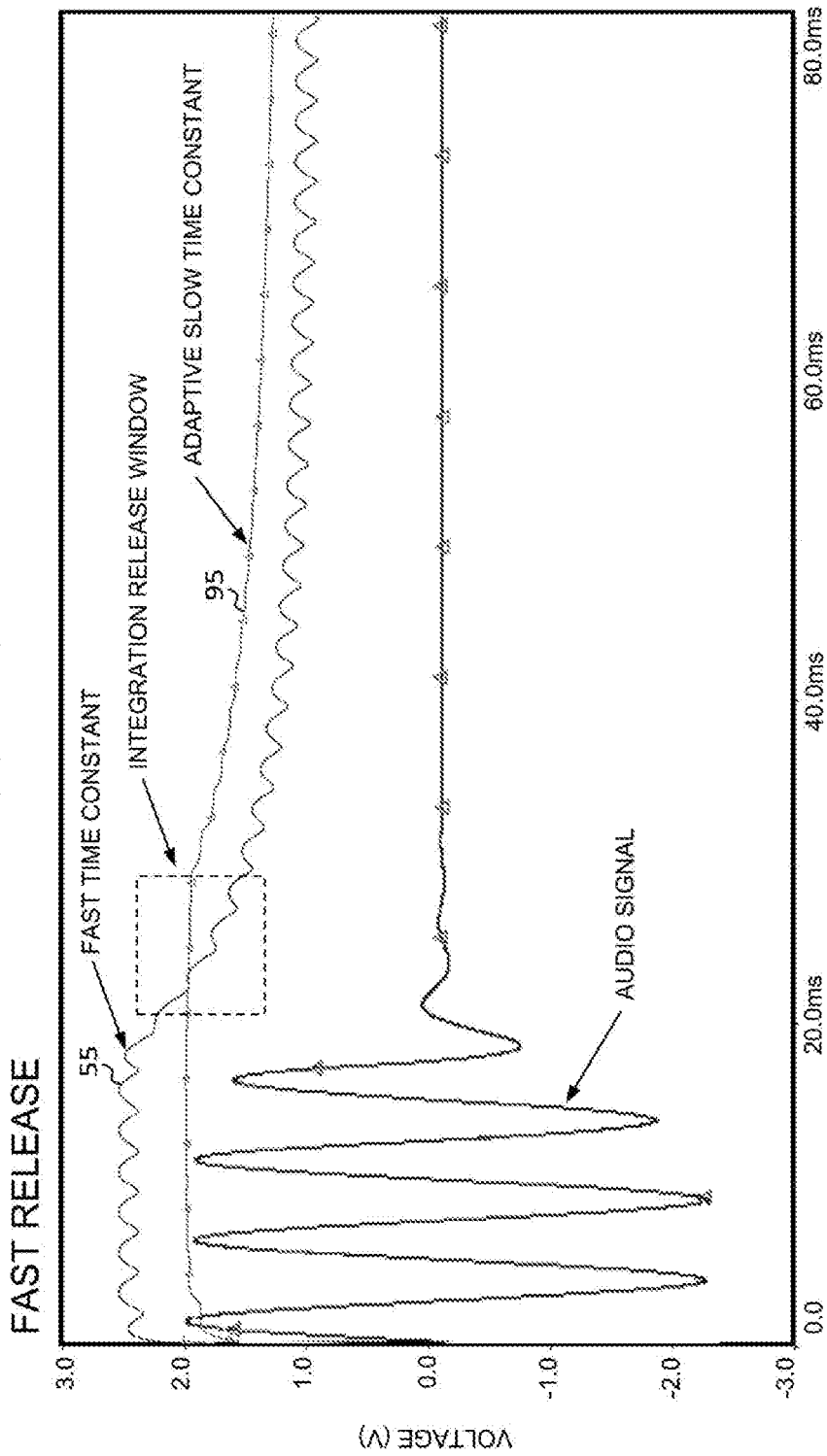

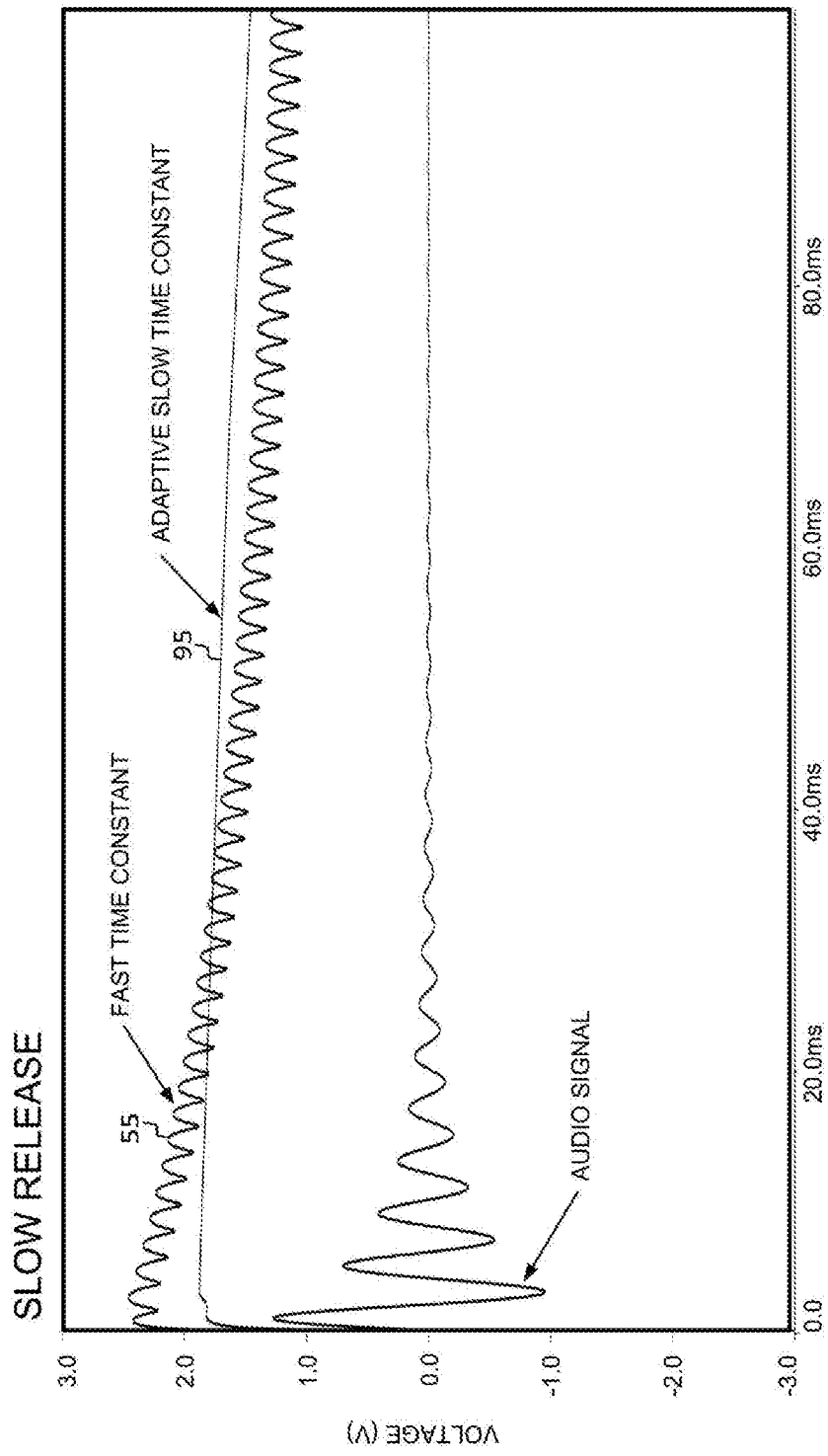

AUDIO DYNAMICS PROCESSING CONTROL SYSTEM WITH INTEGRATION RELEASE WINDOW

BACKGROUND OF THE INVENTION

The present invention relates generally to audio dynamics processors such as compressors, expanders, limiters, noise reduction systems and more particularly concerns audio processors where the level or amplitude of an audio signal is dynamically altered in response to a generated voltage control signal. In particular, the performance of downward expander type noise reduction systems designed for use with audio signals like musical instruments will greatly benefit from this invention however, all dynamics processors may see improved performance by use of the present invention. All dynamics processors where a VCA (voltage controlled amplifier) or VCF (voltage controlled filter) is used to modify the amplitude or frequency of an audio signal in response to a DC control signal may see the above mentioned improved performance and transparency by use of this improved dynamics processing control system with an integration release window. It will be apparent to the skilled artisan that the gain of a VCA in the audio path will be controlled by the control signal at the output of the disclosed invention. The skilled artisan is familiar with the use of VCA circuits, where an input signal is applied to the input of the VCA and the output signal amplitude is controlled by a control signal applied to the control port. As will also be apparent to the skilled artisan, the improvements of the invention can also be applied to all dynamics processors. One of the major benefits of the invention will be fully explained in conjunction with below threshold, downward expanders. My U.S. Pat. No. 8,842,852 is a more recent example of improvements in the response of an adaptive control system using downward expansion. The 852 patent disclosed improvements over my prior art system described in U.S. Pat. No. 6,944,305. Below threshold, downward expander type noise reduction systems have been commonly known and used for real time noise reduction in live sound and professional recording applications for many years. The 852 patent discloses a system with improved audio dynamics processing control signal with an exponential release response in order to reduce audible modulation side effects in the audio signal. One of the most successful noise reduction systems for use with musical instruments, such as guitar, bass and keyboards, is a system commercially known as the "Decimator" noise reduction system which has been based on the 305 and 852 patents. While the teachings in the 852 patent are an improvement over the prior art system disclosed in U.S. Pat. No. 6,944,305 which also provided an adaptive release response, under certain conditions and with some complex audio input signals there is still a noticeable modulation of the audio signal due to ripple in the final VCA control signal modulating the VCA. In particular if a guitar input signal is applied with a very dissonant chord or triad of notes and sustained so the dissonant chord slowly fades the resulting complex waveform, when filtered by the prior art systems, will still result in a large amount of ripple in the final VCA control signal. The audible result is a very choppy release response with an undesirable sound and if severe, it can sound like an un-musical grumble or popping in the output signal.

The prior art system provides a log converted, filtered, and buffered signal with a fast time constant. This control signal then feeds a second filter providing a considerably slower long time constant. A differential amplifier is used to derive a differential control signal which then feeds a log converter, the output of which then feeds a current source transistor which feeds a control transistor to increase the release time constant when the differential control signal is large. A diode provides a small dead band between the differential control signal and the logarithmic control signal which changes the long release to a faster time constant as determined by the audio input signal. The main purpose of the logging circuit was to improve the smoothness of the release response as it changes from a slow long time constant to a fast time constant. This was an improvement over the response of the previous design disclosed in the U.S. Pat. No. 6,944,305 patent, however, this design still suffered from ripple in the VCA control signal as the release signal was changing from slow to fast, specifically with long sustained dissonant guitar notes. When a guitar signal is level detected and filtered with a fast time constant the amount of ripple in the filtered signal increases dramatically when dissonant notes or chords are played. The decaying envelope of a fast time constant signal with dissonant notes or chords will have large peaks and dips creating a large amount of ripple in the control signal. By contrast, single notes or notes that are harmonically related will generate a much lower amount of ripple in the decaying envelope. While the 852 design was an incremental improvement in reducing the undesirable ripple with single notes or chords with harmony, it is a desire of the present invention to provide an adaptive response with extremely fast release with fast staccato notes and virtually transparent release response with long sustained notes even if the input signal is a very dissonant guitar chord or combination of dissonant notes. It is another desire to further reduce the amount of ripple on the DC control signal with long, slow decaying sustained guitar signals with dissonant chords or notes so as to completely eliminate any audible ripple or modulation of the adaptive slow time constant release response and still provide extremely fast release with staccato playing. It is a further object of the invention to provide more precise transition between the slow release response and fast release by incorporating an Integration Release Window to eliminate any audible modulation of the VCA with long sustained dissonant notes. It is a further object of the invention to provide a fast time constant signal and a slow time constant signal where the slow time constant signal release response is modified by the fast time constant signal release response incorporating an Integration Release Window which requires the fast time constant to decay by a defined number of decibels before modification of the slow time constant signal takes place so as to eliminate response ripple and modulation of the audio signal. It is a further object of the invention to provide an Integration Release Window which tracks the adaptive slow time constant signal to maintain the same decibel window over the entire release range.

BRIEF DESCRIPTION OF THE DRAWINGS

Other objects and advantages of the invention will become apparent upon reading the following detailed description and upon reference to the drawings in which:

FIG. 3 is a graphical representation of the fast release response of the invention;
FIG. 4 is a graphical representation of the slow release response of the invention.

SUMMARY OF THE INVENTION

Figure 1:
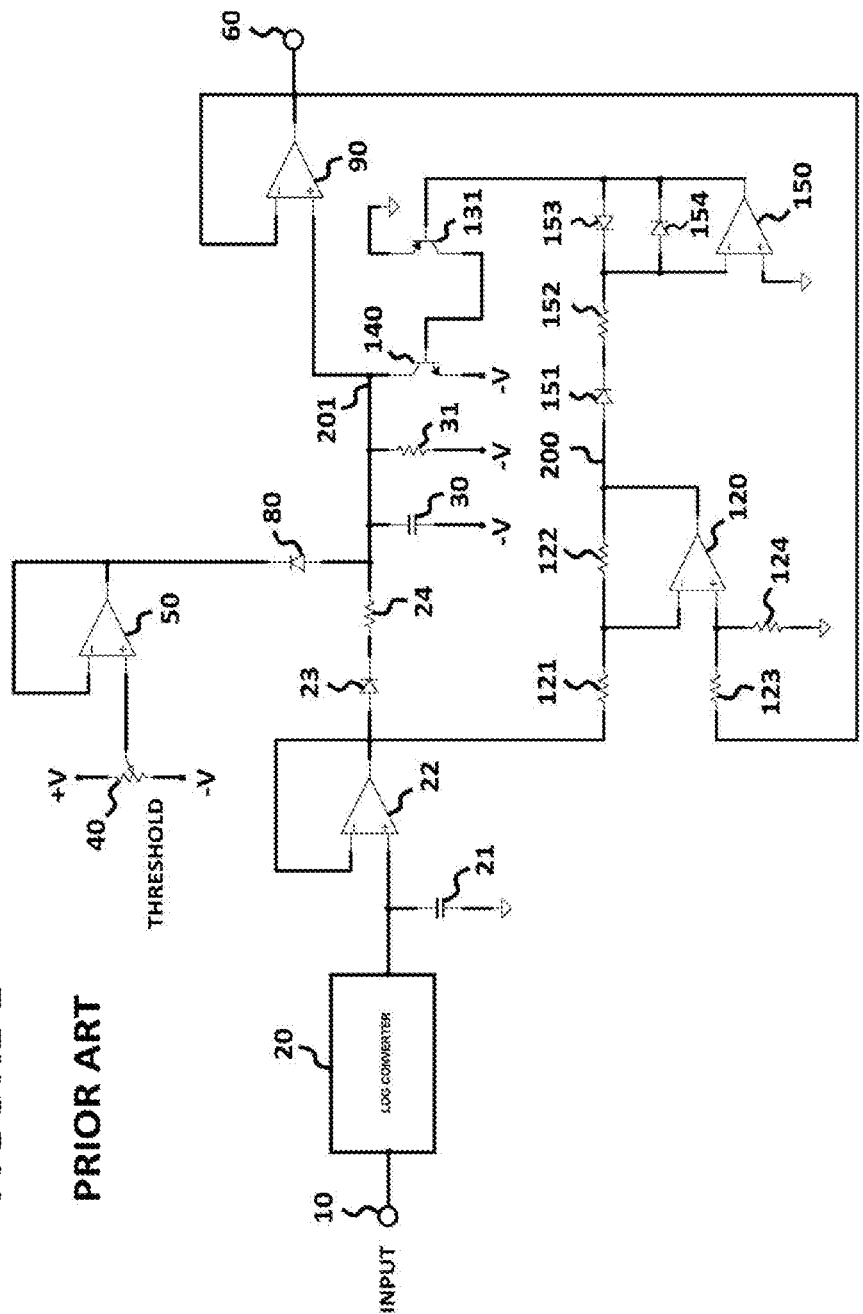
FIG. 1 is a schematic diagram of the prior art.

In accordance with the invention, an improved audio dynamics processing control system incorporating an integration release window is provided where the input signal is first processed by an audio level detector, preferably a logarithmic audio level detector, which provides the absolute value of the logarithm of the input signal. A filter having a very fast time constant smooth's the output of the level detector. The level detected filtered output is then clamped at a predefined threshold point and thus eliminates the need to discharge the second filter capacitor which would otherwise have been overcharged when the input signal drops below the predefined threshold. The clamped level detected filtered fast release signal feeds a second filter with a very slow time constant release. The fast time constant signal modifies the response of the slow time constant signal, accelerating its release response when the fast time constant signal drops below a user defined threshold, whereby the adaptive slow time constant signal is held in the slow time constant response by use of an integration release window where the slow time constant operates for a time period until the fast time constant signal drops by more than a predefined number of decibels. Audio input signals with a very fast decay will cause the fast time constant signal to quickly drop below the slow time constant signal by more than the required difference in decibels as defined by the integration release window. Even large amounts of ripple of the fast time constant cannot appear on the final control signal output due to the integration release window operation which requires the fast time constant signal to drop equivalent to a predefined number of decibels. By incorporation of the integration release window, with a window larger than the maximum possible combined positive and negative going ripple of the fast time constant release response, any ripple in the fast time constant release cannot cause a modulating increase in the slow time constant. Only negative going peaks in the fast time constant can modify the slow time constant release control signal. Without the integration release window, the ripple in the fast response time constant could cause the modified slow release, which becomes the audio path VCA control voltage, to increase and decrease due to the amplitude of the ripple thereby modulating the gain of the VCA in the audio path causing undesirable audible modulation. By incorporating an integration release window, which requires the fast time constant to decay by a large number of decibels, any positive going ripple in the fast time constant will not pass through to the final VCA control signal. Only negative going peaks in the fast time constant decaying signal cause the slow time constant to decrease in a smooth ripple free response. Only when the audio input signal increases by a number of decibels larger than the decibel range of the integration release window will the audio path gain increase.

Detailed Description Prior Art

Referring to Figure; 1 a schematic diagram of the teaching of the prior art 852 patent is shown. The input signal is applied to a log based converter. The output is filtered by capacitor 21 and buffered by buffer operational amplifier 22. This signal becomes the fast release time constant of the system. The output of buffer 22 feeds the anode of diode 23. The cathode of diode 23 feeds one end of resistor 24. The other end of resistor 24 is connected to the anode side of diode 80 which clamps the voltage at resistor 24 at a maximum that cannot exceed the user defined threshold voltage at the output of buffer amplifier 50. Capacitor 30 and resistor 31 define the slow release time of the system and are connected to node 201. The output of node 201 is buffered by operational amplifier 90, the output 60 feeds the control port of an audio path Voltage Controlled Amplifier VCA to provide the gain control of the audio signal path. Differential Amplifier 120 compares the difference between the fast time constant at buffer 22 and the adaptive slow time constant output at buffer 90. A differential control signal 200 is fed to logging amplifier 150 via diode 150. The output of logging amplifier 150 feeds control transistor 131 which has the emitter connected to ground. As the signal at the output of logging amplifier 150 drops below ground control transistor 131 feeds base current to transistor 140 which increases the release response of capacitor 30. While diode 23 and logging amplifier 150 provided an improvement in reducing the fast time constant ripple in the final output control signal at output 60, it did not eliminate this ripple, especially when a slow decaying guitar input signal with dissonant chords were applied.

DETAILED DESCRIPTION OF THE INVENTION

Figure 2:
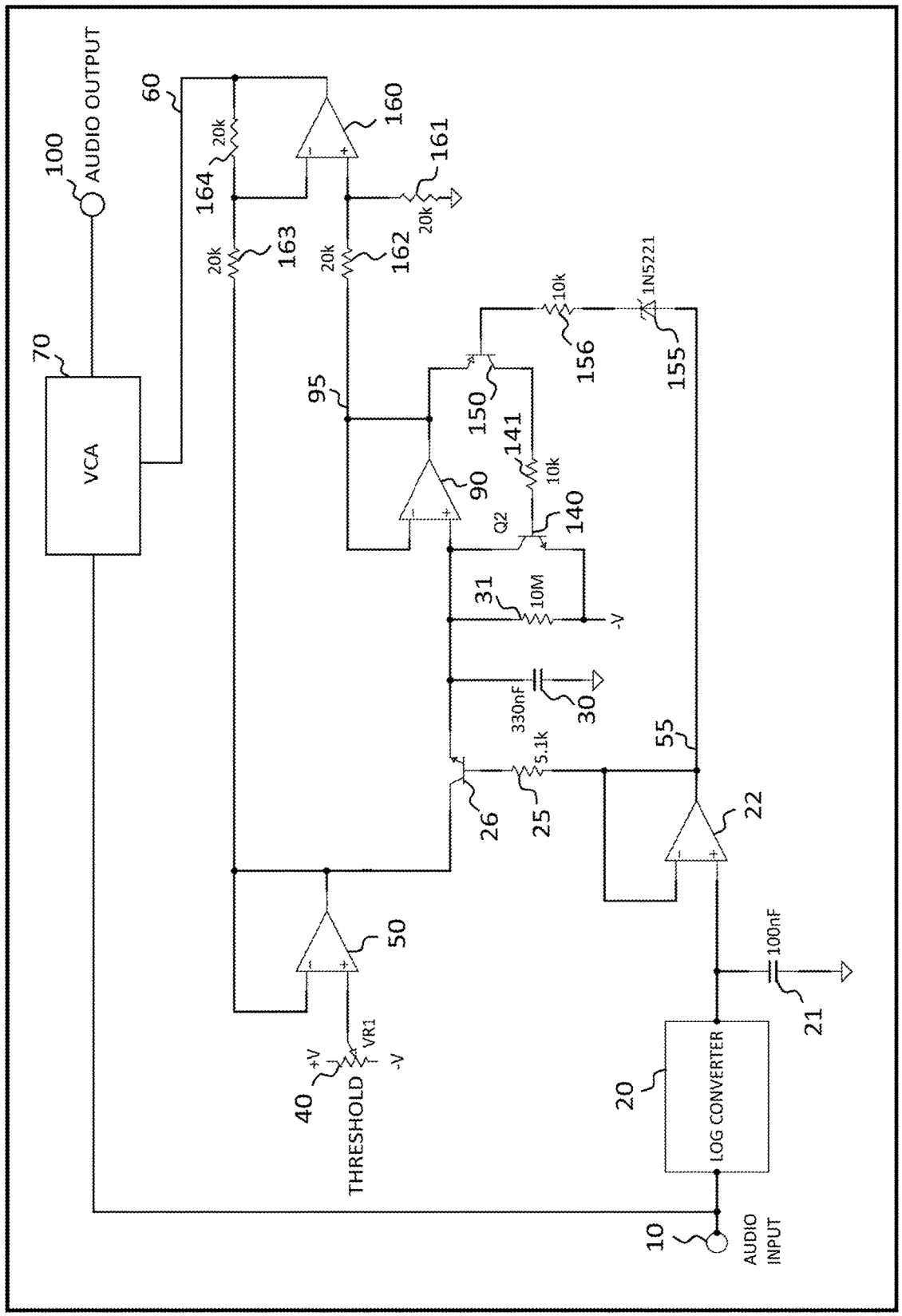
FIG. 2 is a schematic diagram of the current invention.

Referring to FIG. 2; a schematic diagram of one embodiment of the invention is shown. Similar reference designations are used to that of the Prior Art disclosure of FIG. 2. Input node 10 and the input of signal path VCA 70 receive the audio input signal. The audio input signal 10 is applied to the input of a log converter 20. The output of log converter 20 is linear in volts per decibel allowing easy interface with the audio path VCA 70 which typically will provide a log based control port. The output of log converter 20 is a full wave rectified logarithmic signal which is filtered by capacitor 21 and buffered by buffer amplifier 22. The output signal 55 of buffer amplifier 22 is a fast time constant signal and is applied to one end of resistor 23 and the other end of resistor 23 is connected to the base of transistor 24. The collector of transistor 24 is connected to buffer amplifier 50 which provides a DC signal equal to the user defined threshold adjusted by potentiometer 40. The emitter of transistor 24 is connected to slow time constant release filter capacitor 30, slow time constant release resistor 31, control transistor 140, and the input of buffer amplifier 90. The output signal 95 of buffer amplifier 90 feeds the positive input of differential amplifier 160. The negative input of differential amplifier 160 is connected to the threshold buffer 50 output. Final control output signal 60 is the difference between the user set threshold point at the output of buffer amplifier 50 and the adaptive slow release signal at the output of buffer amplifier 90. The emitter of transistor 24 can never exceed the user defined threshold voltage at the output of buffer 50, which effectively clamps the maximum charge applied to timing capacitor 30 at the user defined threshold point. Transistor 150 has the emitter tied to the output of buffer 90, which means the emitter voltage will track the adaptive slow time constant release output voltage. The collector of transistor 150 is connected to resistor 141 which provides base drive for transistor 140 and varies the slow time constant release current adaptively changing the slow release response. The output signal 55 of the fast time constant signal buffer amplifier 22 is connected to zener diode 152 which is selected to provide a large voltage offset to determine the integration release window decibel drop of the fast time constant release before any modification of the slow time constant release. Resistor 151 is connected between the base of control transistor 150 and the cathode of integration release window zener diode 152. In operation, when a large input signal is applied, the buffer output 22 of the fast time constant will charge slow time constant capacitor 30 though transistor 24. The maximum voltage applied to capacitor 30 can never exceed the maximum voltage at threshold buffer 50 to effectively clamp the voltage at capacitor 30 equal to the maximum threshold voltage. When the input signal drops below the user defined threshold at buffer amplifier 50, the output voltage at slow time constant release output buffer 90 will start to drop with a time constant set by the value of capacitor 30 and discharge resistor 31, which will be an extremely long release. This slow time constant release will not change until the signal at the output of fast time constant buffer 22 drops by more than the integration release window zener diode 152. This window voltage is selected to exceed the maximum possible ripple voltage that can ever appear at the output of fast release buffer 22. By selecting this window voltage to be larger than the ripple seen at the output of buffer 22 even when a guitar signal with a dissonant chord is being played, the slow time constant release response will be smooth. Since the emitter of transistor 150 is tied to the slow time constant release output buffer 90, the integration release window will continue to follow the adaptive slow time constant release voltage to ensue the fact that, any ripple in the fast time constant release output at buffer 22 cannot cause a positive going increase in the decay response of the slow time constant release output at buffer amplifier 90. This means the slow time constant release response will now track the negative going peaks at the fast release output buffer 22 avoiding any modulation of the release response. This allows extremely fast staccato playing to still provide an extremely fast release at the final output signal 60 and also provide a slow ripple free modified adaptive slow response to track the actual envelope of the audio input signal.

Referring now to FIG. 3; a graphical representation of an audio input signal with a fast decay is shown. The graph includes a sine wave audio input signal, fast time constant signal 55, adaptive slow time constant signal 95, and also shows the effective range of the integration release window. A sine wave audio input signal is applied to the input of the system at 10, which produces a nearly instantaneous attack time for both the fast time constant and the adaptive slow time constant signals. After approximately 15 milliseconds, the audio signal amplitude drops quickly. Looking at the fast time constant signal the ripple is clearly seen even with a pure sine wave. If the input signal was an actual guitar signal with dissonant notes, the amplitude of the ripple would be considerably higher. The skilled artisan will understand that this input signal scenario with a pure sine wave will produce a lower amount of ripple at the fast time constant output. The sine wave input signal does illustrate the operational aspects of the integration release window. The ripple signal does not appear on the adaptive slow time constant signal in part due to the clamping of the signal when it is above the user defined threshold point. Once the audio signal drops quickly, the fast time constant signal drops tracking the audio input signal. The Integration Release Window keeps the adaptive slow time constant at the maximum un-modified slow release during the required drop of the fast release time constant until the required decibel drop has been achieved, typically a 6 db or greater window. A smaller integration release window on the order of 3db with minimal increase in final control signal ripple. The tradeoff becomes increased control ripple with long sustained notes for faster staccato tracking. After the fast time constant signal exceeds the predefined integration release window, the adaptive slow time constant release response will be modified by turning on control transistor 150 of FIG. 2, which then applies base current to release transistor 140 of FIG. 2 dynamically increasing the release response. Referring again to FIG. 3, after approximately 20 milliseconds of the adaptive response, the slow time constant signal reverts back to the un-modified slow release response. It also becomes apparent that the adaptive slow time constant release never goes positive over this adaptive response time period, the response tracks only the negative going peaks of the fast time constant. This is illustrated looking at the adaptive slow time constant 95 once the fast time constant signal 55 drops below the integration release window. Only the negative going peaks in the fast time constant increase the release response of the adaptive slow time constant. Signal 95 will not have any positive going voltage as the signal decays, which would cause an increase in the VCA gain. By providing an integration release window requiring a large drop in input decibels before any modification of the slow time constant release response, any large amount of ripple in the fast release response cannot cause any increase in the VCA control voltage, only negative going decreases based on the negative peaks in the fast time constant release signal will modify the slow release response. This means even with a guitar input signal with dissonant notes producing a large amount of ripple in the fast time constant release response, the positive and negative peaks cannot exceed the predefined integration release window. This eliminates the possibility for modulating the VCA in the audio path with any increase in gain as the input signal decays. The final release response provided is smoothly decreasing without any undesirable audible side effects in the audio path.

Referring now to FIG. 4; a graphical representation of a sine wave audio input signal with a slow sustained decay is shown. The graph includes a sine wave audio input signal, fast release time constant 55, and adaptive slow release time constant 95. The integration release window is not shown since the release response does not exceed the operating window in this example. As in FIG. 3, a sine wave audio input signal is applied to the input of the system at 10, which produces a nearly instantaneous attack time for both the fast time constant and the adaptive slow time constant signals. The input signal decays over a much longer time period than that of FIG. 3, approximately 50 milliseconds from the initial transient. Due to the slower decay of the input signal, the fast time constant never drops below the predetermined integration release window. The integration release window's operating decibel range continues to drop in relation to the output signal of the adaptive slow time constant release. Referring back to FIG. 2, the tracking of the integration release window is due to the emitter of control transistor 150 being connected to the output of the adaptive slow time constant buffer amplifier 90. It will be understood that the release response will dynamically change based on the actual input signal and can provide extremely fast ripple free response with both fast staccato notes and with very long sustained slow decaying signals. Even if the input signal is a guitar with very dissonant notes, or chords, the control signal will be smooth and ripple free.

It is also understood that all of the above disclosed aspects of the invention can also be realized by use of Digital Signal Processing techniques. Specific algorithms incorporating some or all aspects of the invention are clearly anticipated.

Thus, it is apparent that there has been provided, in accordance with the invention, an improved audio dynamics processing control system with an integration release window that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A process for conditioning an input audio signal comprising the steps of:
    level detecting the input audio signal to provide a first control signal having a fast time constant;
    filtering the first control signal to provide a second control signal having a slow time constant;
    conditioning the first control signal with a predefined integration release window; and
    modifying the second control signal in relation to the first control signal to increase the release of the second control signal, providing an adaptive slow time constant.

2. A process according to claim 1 further comprising the step of varying an upper limit of the predefined integration release window in relation to the second control signal.

3. For conditioning an input audio signal, an audio signal processor comprising:
    a level detector deriving a first control signal from said input audio signal, said first control signal having a fast time constant;
    a filter modifying said first control signal to provide a second control signal having a slow time constant;
    a zener diode conditioning said first control signal with a predefined integration release window before modifying said second control signal in relation to said first control signal to increase a release response of said second control signal providing an adaptive slow time constant; and
    a transistor varying the an upper limit of said integration release window in relation to said adaptive slow time constant.

* * * * *